(12) United States Patent
Ieong et al.

(10) Patent No.: US 7,834,425 B2
(45) Date of Patent: Nov. 16, 2010

(54) HYBRID ORIENTATION SOI SUBSTRATES, AND METHOD FOR FORMING THE SAME

(75) Inventors: Meikei Ieong, Wappingers Falls, NY (US); Xinlin Wang, Poughkeepsie, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 12/115,065

(22) Filed: May 5, 2008

(65) Prior Publication Data

US 2008/0203442 A1    Aug. 28, 2008

Related U.S. Application Data

(62) Division of application No. 11/411,280, filed on Apr. 26, 2006, now Pat. No. 7,385,257.

(51) Int. Cl.
*H01L 29/04* (2006.01)
*H01L 29/76* (2006.01)
*H01L 29/94* (2006.01)

(52) U.S. Cl. .................... 257/627; 257/64; 257/347; 257/521; 257/527; 257/628; 257/E21.036; 257/E21.233; 257/E29.003; 257/E29.004; 257/E29.105; 438/198

(58) Field of Classification Search .................... 257/64, 257/347, 521, 527, 627, 628, E21.036, E21.233, 257/E29.003, E29.004, E29.105; 438/198
See application file for complete search history.

(56) References Cited

U.S. PATENT DOCUMENTS

| | | | |
|---|---|---|---|
| 6,972,478 B1 * | 12/2005 | Waite et al. .................. | 257/627 |
| 7,226,833 B2 * | 6/2007 | White et al. .................. | 438/222 |
| 7,538,390 B2 * | 5/2009 | Wang et al. .................. | 257/347 |
| 2004/0256700 A1 | 12/2004 | Doris et al. | |
| 2006/0145264 A1 | 7/2006 | Chidambarrao et al. | |
| 2007/0037329 A1 * | 2/2007 | Kelman ....................... | 438/154 |
| 2007/0090467 A1 * | 4/2007 | Zhu ............................ | 257/390 |

OTHER PUBLICATIONS

Yang, M. et al. "High Performance CMOS Fabricated on Hybrid Substrate With Different Crystal Orientations." *Technical Digest of International Electron Devices Meeting*, pp. 453, 2003.

* cited by examiner

*Primary Examiner*—Dao H Nguyen
(74) *Attorney, Agent, or Firm*—Scully, Scott, Murphy & Presser, P.C.; Gail H. Zarick, Esq.

(57) ABSTRACT

The present invention relates to a hybrid orientation semiconductor-on-insulator (SOI) substrate structure that contains a base semiconductor substrate with one or more first device regions and one or more second device regions located over the base semiconductor substrate. The one or more first device regions include an insulator layer with a first semiconductor device layer located atop. The one or more second device regions include a counter-doped semiconductor layer with a second semiconductor device layer located atop. The first and the second semiconductor device layers have different crystallographic orientations. Preferably, the first (or the second) device regions are n-FET device regions, and the first semiconductor device layer has a crystallographic orientation that enhances electron mobility, while the second (or the first) device regions are p-FET device regions, and the second semiconductor device layer has a different surface crystallographic orientation that enhances hole mobility.

13 Claims, 2 Drawing Sheets

HYBRID ORIENTATION SOI SUBSTRATES, AND METHOD FOR FORMING THE SAME

RELATED APPLICATIONS

This application is a divisional of U.S. patent application Ser. No. 11/411,280, filed Apr. 26, 2006.

FIELD OF THE INVENTION

The present invention relates to semiconductor-on-insulator (SOI) substrates that have hybrid surface orientations and can be used for forming complementary metal-oxide-semiconductor (CMOS) devices. More specifically, the present invention relates to a SOI substrate that comprises one or more device regions with a surface orientation suitable for forming n-channel field effect transistors (n-FETs) and one or more device regions with a different surface orientation suitable for forming p-channel field effect transistors (p-FETs), as well as to a method for forming such a SOI substrate.

BACKGROUND OF THE INVENTION

In present semiconductor technology, CMOS devices, such as n-FETs and p-FETs, are typically fabricated upon semiconductor wafers that each has a substrate surface oriented along one of a single set of equivalent crystal planes of the semiconductor material (e.g., Si) that forms the substrate. In particular, most of todays semiconductor devices are built upon silicon wafers having wafer surfaces oriented along one of the {100} crystal planes of silicon.

Electrons are known to have a high mobility along the {100} crystal planes of silicon, but holes are known to have high mobility along the {110} crystal planes of silicon. Specifically, hole mobility values along the {100} planes are roughly about 2 to 4 times lower than the corresponding electron mobility values along such planes. In contrast, hole mobility values along the {110} silicon surfaces are about 2 times higher than those along the {100} silicon surfaces, but electron mobility along the {110} surfaces are significantly degraded compared to those along the {100} surfaces.

As can be deduced from the above, the {110} silicon surfaces are optimal for forming p-FET devices due to the excellent hole mobility along the {110} planes, which leads to higher drive currents in the p-FETs. However, such surfaces are completely inappropriate for forming n-FET devices. The {100} silicon surfaces instead are optimal for forming n-FET devices due to the enhanced electron mobility along the {100} planes, which results in higher drive currents in the n-FETs.

Therefore, it is advantageous to form a semiconductor substrate having different surface orientations (i.e., hybrid surface orientations) that provide optimal performance for both the n-channel and p-channel complementary FET devices.

U.S. Patent Application Publication No. 2004/0256700 to Doris et al. describes a hybrid orientation substrate formed by wafer bonding, etching, and epitaxial regrowth. However, only one of the complementary device regions contained by such a hybrid orientation substrate has a buried insulator layer and constitutes a SOI structure, while the other of the complementary device regions does not contain any buried insulator layer and only constitutes a bulk structure.

Min Yang et. al. (M. Yang, et. al. *Technical Digest of International Electron Devices Meeting*, pp. 453, 2003) described a novel MOSFET structure for high performance CMOS using Hybrid Orientation Technology (HOT), where p-FETs were fabricated on a {110} surface orientation and n-FETs on a {100} orientation, by taking advantage of the carrier mobility dependence on surface orientation. However, in the HOT structures disclosed by Min Yang et al, one type of MOSFET is on SOI while the other one behaves bulk-like.

The benefits of SOI substrate structures over their bulk counterparts are well known, which include, but are limited to: reduction of junction leakage, reduction of junction capacitance, reduction of short channel effects, better device performance, higher packing density, and lower voltage requirements.

There is therefore a need to provide an improved hybrid orientation substrate having both complementary device regions configured as SOI structures for further improvements of the device performance.

SUMMARY OF THE INVENTION

The present invention provides an improved hybrid orientation substrate, which contains one of the complementary device regions with a first surface crystallographic orientation and a SOI configuration achieved by a buried insulator layer and the other of the complementary device regions with a second, different surface crystallographic orientation and a pseudo-SOI configuration achieved by a counter-doped semiconductor layer.

The counter-doped semiconductor layer of the present invention effectively isolates the semiconductor device layer from the base semiconductor substrate and therefore creates a floating body at the other of the complementary device regions, which is comparable to that created by the buried insulator layer in a true SOI configuration.

In one aspect, the present invention relates to a substrate comprising:
- a base semiconductor substrate having a first conductivity type and a first crystallographic orientation;
- one or more first device regions located over the base semiconductor substrate, wherein the one or more first device regions comprising an insulator layer with a first semiconductor device layer located thereover, and wherein the first semiconductor device layer has a second, different crystallographic orientation; and
- one or more second device regions located over the base semiconductor substrate, wherein the one or more second device regions comprising a counter-doped semiconductor layer of a second, opposite conductivity type with a second semiconductor device layer located thereover, and wherein the second semiconductor device layer has the first conductivity type and the first crystallographic orientation.

Preferably, the first and second semiconductor device layers have substantially coplanar upper surfaces (i.e., with less than ±20 nm offset).

In a specific embodiment of the present invention, the first device regions are n-FET device regions, and the second device regions are p-FET device regions. If the base semiconductor substrate, the first semiconductor device layer, and the second semiconductor device layer all comprise single crystal silicon, it is preferred that the first crystallographic orientation is one of the <110> orientations of silicon; the second, different crystallographic orientation is one of the <100> orientations of silicon; the first conductivity type is p-type; and the second, opposite conductivity type is n-type. In this manner, the device performances of both the n-FETs and the p-FETs are optimized.

In an alternative embodiment of the present invention, the first device regions are p-FET device regions, and the second device regions are n-PET device regions. If the base semiconductor substrate, the first semiconductor device layer, and the second semiconductor device layer all comprise single crystal silicon, it is preferred that the first crystallographic orientation is one of the <100> orientations of silicon; the second, different crystallographic orientation is one of the <110> orientations of silicon; the first conductivity type is n-type; and the second, opposite conductivity type is p-type. In this manner, the device performances of both the n-FETs and the p-FETs are optimized.

In another aspect, the present invention relates to a semiconductor device containing one or more n-FETs and one or more p-FETs located at the corresponding device regions of the hybrid orientation substrate as described hereinabove.

In a further aspect, the present invention relates to a method that comprises:

forming a base semiconductor substrate having a first conductivity type and a first crystallographic orientation;

forming an insulator layer and a first semiconductor device layer of a second, different crystallographic orientation over the base semiconductor substrate;

selectively removing portions of the first semiconductor device layer and the insulator layer from one or more regions of the base semiconductor substrate, thereby forming one or more first device regions that contain the insulator layer and the first semiconductor device layer and one or more second device regions that do not contain the insulator layer and the first semiconductor device layer, wherein an upper surface of the base semiconductor substrate is exposed at the one or more second device regions;

epitaxially growing a counter-doped semiconductor layer over the base semiconductor substrate at the one or more second device regions, wherein the counter-doped semiconductor layer has a second, opposite conductivity type; and epitaxially growing a second semiconductor device layer over the counter-doped semiconductor layer at the one or more second device regions, wherein the second semiconductor device layer has the first conductivity type and the first crystallographic orientation.

Preferably but not necessarily, the insulator layer and the first semiconductor device layer are bonded to the base semiconductor substrate by wafer bonding, and the selective removal of the portions of the first semiconductor device layer and the insulator layer can be achieved by etching.

Further, it is preferred that dielectric spacers are formed along exposed sidewalls of the insulator layer and the first semiconductor device layer after selective removal of portions of the first semiconductor device layer and the insulator layer, but before epitaxial growth of the counter-doped semiconductor layer. It is also preferred that one or more isolation regions are formed between the first and second device regions after epitaxial growth of the second semiconductor device layer.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The term "counter-doped" as used herein refers to a structure that is doped with a dopant species of a conductivity type that is opposite to that of the surrounding environment. For example, when a semiconductor substrate is p-doped, an n-doped layer buried in such a p-doped substrate is considered a counter-doped layer. Alternatively, when a semiconductor substrate is n-doped, a p-doped layer buried in such an n-doped substrate is considered a counter-doped layer.

The present invention provides hybrid orientation SOI substrates that contain different device regions with different surface crystallographic orientations. More specifically, each of the hybrid orientation SOI substrates of the present invention comprises one or more first device regions and one or more second device regions located over a base semiconductor substrate. The first device regions comprise an insulator layer with a first semiconductor device layer located thereover. The second device regions comprise a counter-doped semiconductor layer with a second semiconductor device layer located thereover. The first and second device regions have different surface crystallographic orientations, thereby rendering the substrate a hybrid orientation substrate. Further, the insulator layer at the first device regions and the counter-doped semiconductor layer at the second device regions function to electrically isolate the first and second semiconductor device layers from the base semiconductor substrate, thereby creating "floating" semiconductor bodies and rendering the substrate a SOI or pseudo-SOI structure.

Figure 1:
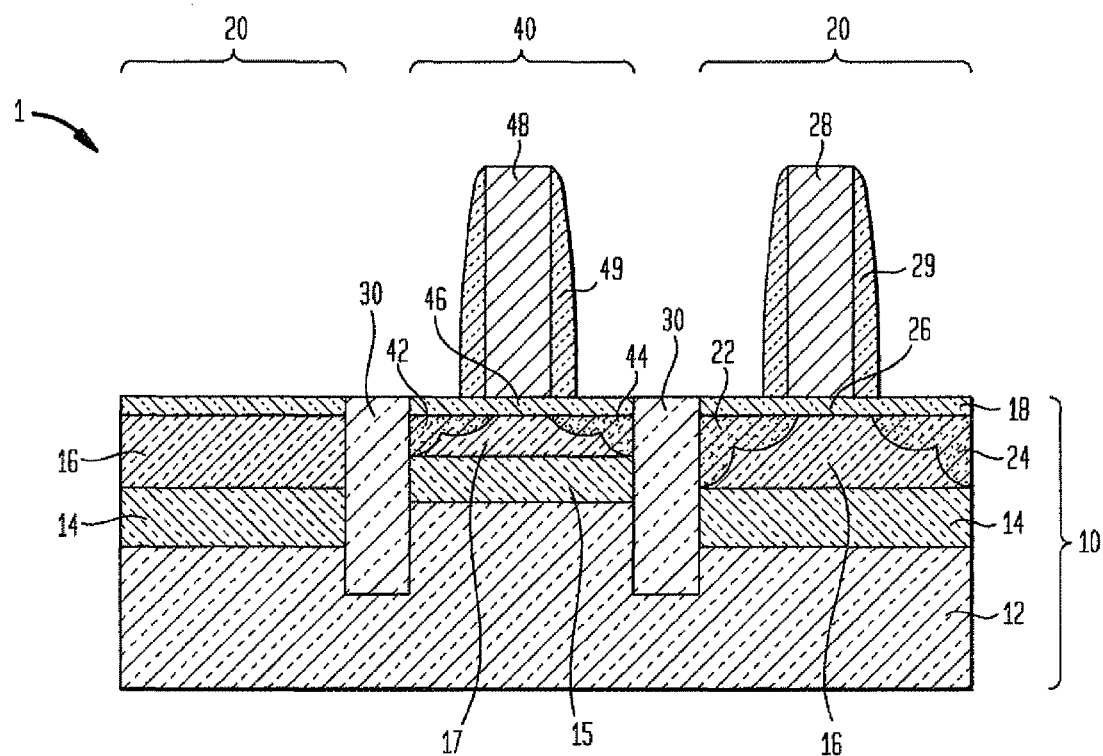
FIG. 1 is a cross-sectional view of a CMOS circuit containing an n-FET and a p-FET located at different device regions of a hybrid orientation SOI substrate, according to one embodiment of the present invention.

FIG. 1 is a cross-sectional view of a CMOS circuit 1 containing an n-FET and a p-FET located at different device regions of a hybrid orientation SOI substrate, according to one embodiment of the present invention.

Specifically, the hybrid orientation SOI substrate 10 comprises a base semiconductor substrate 12 with first and second device regions 20 and 40 located atop.

The base semiconductor substrate 12 may comprise any single crystal semiconductor material, which includes, but is not limited to: Si, SiC, SiGe, SiCeC, Ge alloys, GaAs, InAs, InP, as well as other III-V or ii-VI compound semiconductors. In some embodiments of the present invention, it is preferred that the base semiconductor substrate 12 be composed of a Si-containing semiconductor material, i.e., a semiconductor material that includes silicon. The base semiconductor substrate 12, or at least a portion thereof at the device region 20, is doped with a dopant species of a first conductivity type, i.e., either p-type or n-type. Further, the base semiconductor substrate 12 has a first crystallographic orientation. In a preferable, but not necessary, embodiment of the present invention, the base semiconductor substrate 12 comprises single crystal silicon, and the first crystallographic orientation is selected from the group consisting of the <100>, the <110>, and the <111> orientations of silicon.

The first and second device regions 20 and 40 are preferably isolated from each other by one or more isolation regions 30. The isolation regions 30 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

The first device regions 20, on one hand, each contains a buried insulator layer 14 with a first semiconductor device layer 16 atop. In this manner, the buried insulator layer 14 electrically isolates the first semiconductor device layer 16 from the base semiconductor substrate 12, thereby creating a floating body at device regions 20 and forming a SOI structure.

The buried insulator layer 14 may comprise any suitable insulator material(s), and it typically comprises an oxide, a nitride, or an oxynitride in either a crystalline phase or a non-crystalline phase. Typically, the buried insulator layer 14 has a thickness ranging from about 5 nm to about 300 nm, with from about 50 nm to about 150 nm being more typical.

The first semiconductor device layer 16 may comprise the same semiconductor material as the base semiconductor substrate 12, or it may comprise a different single crystal semiconductor material selected from the group including: Si, SiC, SiGe, SiGeC, Ge alloys, GaAs, InAs, InP, as well as other III-V or II-VI compound semiconductors. The first semiconductor device layer 16 can be either doped (with n- or p-type dopant) or undoped, and it has a second crystallographic orientation that is different from the first crystallographic orientation of the base semiconductor substrate 12. In a preferable, but not necessary, embodiment of the present invention, the first semiconductor device layer 16 comprises single crystal silicon, and the second, different crystallographic orientation is selected from the group consisting of the <100>, the <110>, and the <111> orientations of silicon. Typically, the first semiconductor device layer 16 has a thickness ranging from about 5 nm to about 150 nm, with from about 20 nm to about 70 nm being more typical.

The second device regions 40, on the other hand, each contains a counter-doped semiconductor layer 15 with a second semiconductor device layer 17 atop. Both the counter-doped semiconductor layer 15 and the second semiconductor device layer 17 preferably comprise the same semiconductor material as the base semiconductor substrate 12 and have the same crystallographic orientation as the base substrate 12 (i.e., the first crystallographic orientation). The second semiconductor device layer 17 is doped with a dopant species having the first conductivity type, i.e., either p-type or n-type, while the counter-doped semiconductor layer 15 is doped with a dopant species having a second, opposite conductivity type, i.e., either n-type or p-type. In this manner, the counter-doped semiconductor layer 15 functions to electrically isolate the second semiconductor device layer 17 from the base semiconductor substrate 12, thereby creating a floating body and a pseudo-SOI structure at device regions 40, which is comparable to that created by the buried insulator layer 14 in the true SOI structure at device regions 20.

The physical thickness of the counter-doped semiconductor layer 15 may range from about 5 nm to about 150 nm, with from about 10 nm to about 50 nm being more typical. Further, layer 15 preferably has a dopant concentration ranging from about $10^{14}/cm^3$ to about $10^{20}/cm^3$, or more preferably from about $10^{17}/cm^3$ to about $10^{19}/cm^3$. Any suitable dopant species of the proper conductivity type can be used for doping layer 15. For n-type doping, dopant species such as phosphorus, arsenic, and antimony can be used. For p-type doping, dopant species such as boron, aluminum, gallium, and indium can be used.

The physical thickness of the second semiconductor layer 17 may range from about 5 nm to about 150 nm, with from about 20 nm to about 70 nm being more typical.

An optional surface dielectric layer 18 can be provided to cover both the first and second semiconductor device layers 16 and 17 at device regions 20 and 40. A portion of such optional surface dielectric layer 18 (i.e., portion 26) functions as the gate dielectric for one FET device, and another portion of such surface dielectric layer 18 (i.e., portion 46) functions as the gate dielectric for another, complementary FET device.

As a result, the first and second semiconductor device layers 16 and 17, which are located at two different device regions 20 and 40 with substantially coplanar upper surfaces, have different crystallographic orientations and can readily be used to fabricate respective CMOS devices with enhanced device performance.

FIG. 1 specifically shows two complementary FET devices (i.e., one is an n-FET and the other is a p-FET) with source regions 22 and 42, drain regions 24 and 44, gate dielectrics 26 and 46, gate conductors 28 and 48, and optional sidewall spacers 29 and 49. Channel regions of these complementary FET devices are located in the first and second semiconductor device layers 16 and 17, respectively between the source regions 22 and 42 and drain regions 24 and 44. Because the first and second semiconductor device layers 16 and 17 have different crystallographic orientations, the channel regions of the complementary FET devices correspondingly having different crystallographic orientations, which are arranged and constructed to optimize the device performances of both FET devices.

For a specific example, the first device regions 20 contains n-FET devices, and the second device regions 40 contains p-FET devices. In this instance, it is preferred that the first semi-conductor device layer 16 has a crystallographic orientation that is one of the <100> direction of silicon, while the base substrate 12 and the second semiconductor device layer 17 both have a crystallographic orientation that is one of the <110> direction of silicon. Further, the base substrate 12 and the second semiconductor device layer 17 both are p-doped, while the counter-doped semiconductor layer 15 is n-doped.

For another specific example, the first device regions 20 contains p-FET devices, and the second device regions 40 contains n-FET devices. In this instance, it is preferred that the first semiconductor device layer 16 has a crystallographic orientation that is one of the <110> directions of silicon, while the base substrate 12 and the second semiconductor device layer 17 both have a crystallographic orientation that is one of the <100> directions of silicon. Further, the base substrate 12 and the second semiconductor device layer 17 both are n-doped, while the counter-doped semi-conductor layer 15 is p-doped.

Although the above-described specific examples uses the <100> and the <110> directions of silicon as exemplary crystallographic orientations of the hybrid substrate 10, it is understood that any other suitable combination of crystallographic orientations of any suitable single crystal semiconductor material can also be provided in the hybrid orientation substrates of the present invention for achieving enhanced device performance.

The hybrid orientation substrates as described hereinabove can be readily formed using wafer bonding, selective etching, epitaxial regrowth, and in situ doping techniques.

Figure 2A:
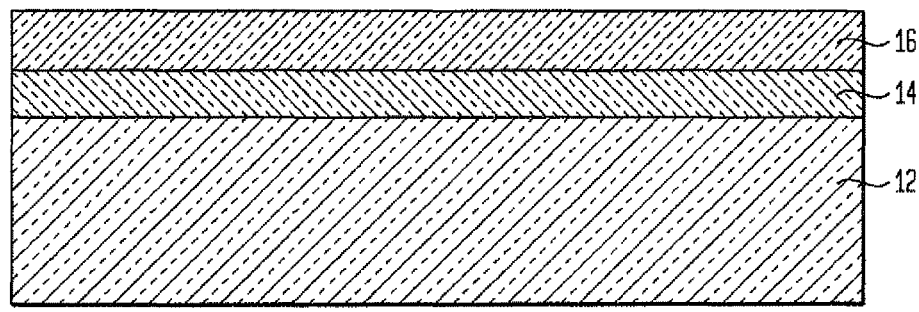
FIGS. 2A-2C illustrate exemplary processing steps for fabricating a hybrid orientation SOI substrate, according to one embodiment of the present invention.
Figure 2B:
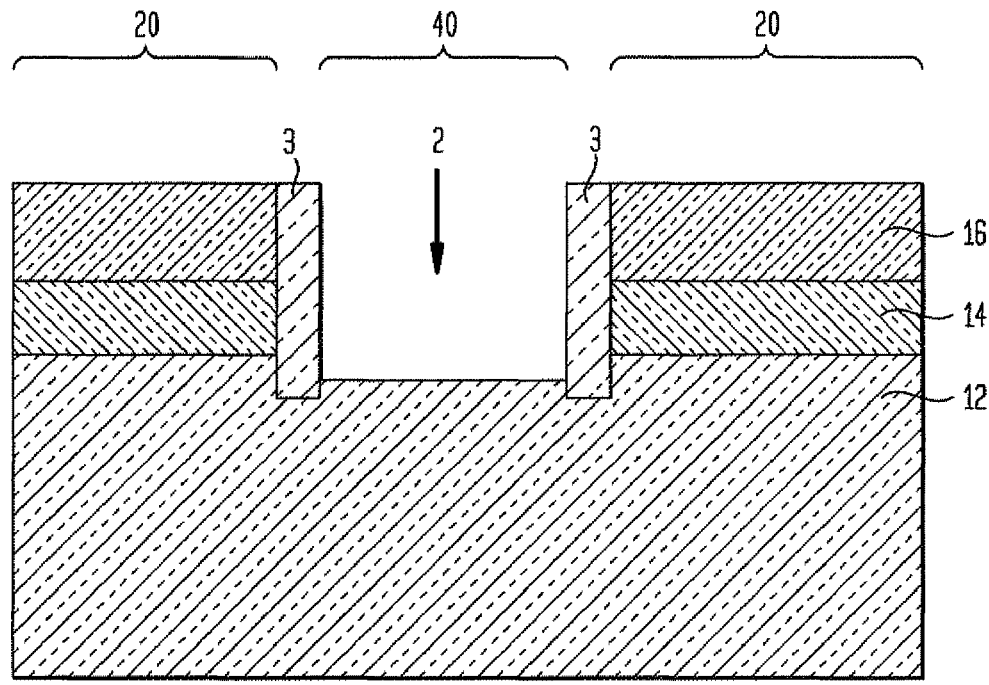
Figure 2C:
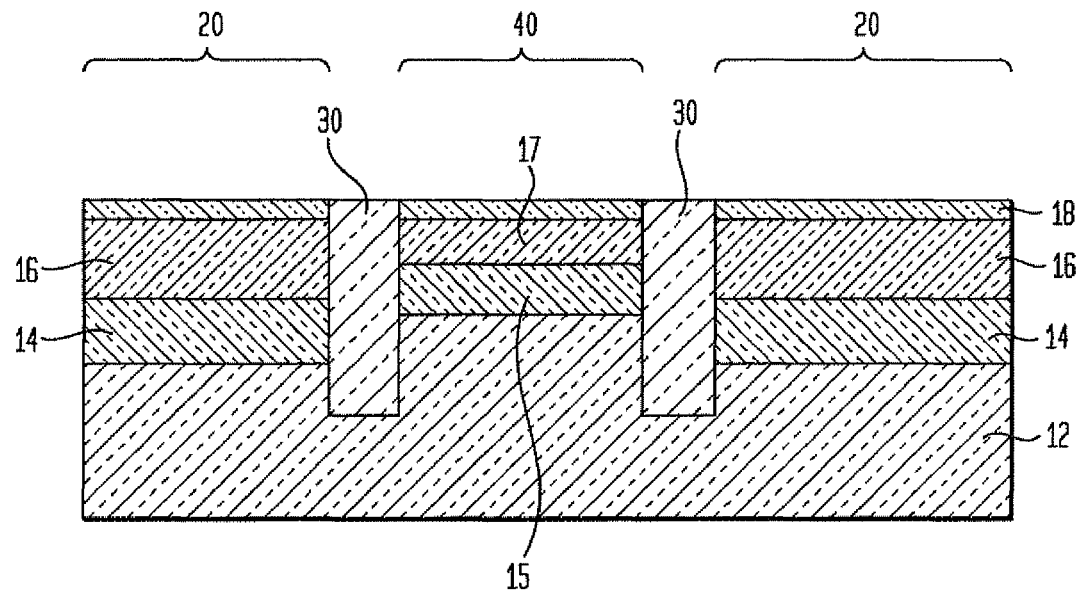

FIGS. 2A-2C illustrate exemplary processing steps for fabricating a hybrid orientation SOI substrate, according to one embodiment of the present invention.

Reference is first made to FIG. 2A, which shows a bonded substrate containing a base semiconductor substrate 12, a buried insulator layer 14, and a first semiconductor device layer 16. The base semiconductor substrate 12 may further comprise one or more additional buried insulator layers (not shown) underneath the buried insulator layer 14.

As mentioned hereinabove, the base semiconductor substrate 12, or at least a portion thereof, is doped with a dopant species of a first conductivity type, i.e., either p-type or n-type. Further, the base semiconductor substrate 12 has a first crystallographic orientation, while the first semiconductor device layer 16 has a second, different crystallographic orientation.

The base substrate 12, the buried insulator layer 14, and the first semiconductor device layer 16 are bonded together by known wafer-bonding techniques. For example, bonding can be achieved by first bringing the wafer layers into intimate contact with one another, optionally applying an external force to the contacted wafer layers, and then heating the wafer layers under conditions that are capable of bonding the layers together. The heating step may be performed in the presence or absence of an external force. The heating step is typically performed in an inert ambient at a temperature ranging from about 200° C. to about 1050° C. for a time period of from about 2 to about 20 hours. More preferably, the bonding is performed at a temperature of from about 200° C. to about 400° C. for a time period of from about 2 to about 20 hours. Room temperature bonding is also contemplated in the present invention. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

A patterned mask (not shown) is then formed on a predetermined portion of the bonded substrate of FIG. 2A, so as to protect a portion of the bonded substrate, while leaving another portion of the bonded substrate unprotected. The protected portion of the bonded substrate defines the first device regions 20, whereas the unprotected portion of the bonded substrate defines the second device regions 40. In one embodiment, the patterned mask is formed on a predetermined portion of the bonded substrate by applying a photoresist mask to the entire upper surface of the first semiconductor device layer 16. After application of the photoresist mask, the photoresist mask is patterned by lithography, which includes the steps of exposing the photoresist to a pattern of radiation and developing the pattern utilizing a resist developer, so as to form the patterned mask. In another embodiment, the patterned mask comprises nitride or oxynitride and is formed and patterned utilizing lithography and etching.

After providing the patterned mask and defining the first and second device regions 20 and 40, the entire structure is subjected to one or more etching steps, which selectively remove unprotected portions of the first semiconductor device layer 16 and the buried insulator layer 14 to form one or more trenches 2 at the second device regions 20, as shown in FIG. 2B. Therefore, an upper surface of the base semiconductor substrate 12 is exposed at the second device regions 20.

The one or more etching steps may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the first semiconductor device layer 16 and the buried insulator layer 14.

After etching, sidewalls of the first semiconductor device layer 16 and the buried insulator layer 14 become exposed in trench 2. Therefore, one or more dielectric liners or spacers 3 can then be formed along the exposed sidewalls of the first semiconductor device layer 16 and the buried insulator layer 14 in trench 2, as shown in FIG. 2B. The dielectric liners or spacers 25 comprise a dielectric material such as, for example, an oxide, and they can be readily formed by deposition and etching.

After formation of the liners or spacers 3, an epitaxial growth process is carried out to grow a semiconductor material on the exposed upper surface of the base semiconductor substrate 12 at and only at the second device regions 40, while the first device regions 20 are protected by the patterned mask (not shown), which deters epitaxial growth at the first device regions.

The epitaxially grown semiconductor material preferably is the same as that formed the base semiconductor substrate 12. Because such a semiconductor material is grown directly over the upper surface of the base semiconductor substrate 12, it has the same crystallographic orientation as the base substrate 12 (i.e., the first crystallographic direction).

During a first stage of the epitaxial growth process, in situ doping is conducted to introduce a dopant species having a conductivity type opposite to that of the base substrate 12, thereby forming a counter-doped layer 15 that has the same crystallographic orientation as the base substrate 12 (i.e., the first crystallographic orientation) but a second, opposite conductivity. Preferably, the in situ doping is conducted by chemical vapor deposition (CVD).

During a second, subsequent stage of the epitaxial growth process, another in situ doping step is conducted to introduce a dopant species having the same conductivity type as the base substrate 12, thereby forming the second semiconductor device layer 17 that has the same crystallographic orientation (i.e., the first crystallographic orientation) and the same conductivity type as the base substrate 12. Alternatively, the second, subsequent stage of the epitaxial growth process may be dopant-free, i.e., no dopant species is introduced into the second semiconductor device layer 17 during the epitaxial growth process, while a dopant species having the same conductivity type as the base substrate 12 is subsequently introduced into layer 17 after the epitaxial growth process via ion implantation.

After the epitaxial growth, the entire structure is subjected to a planarization process, such as chemical mechanical polishing (CMP) or grinding, so that the upper surfaces of the first and second semiconductor device layers 16 and 17 at the first and second device regions 20 and 40 are substantially planar with each other.

Note that the patterned mask (not shown) overlaying the first semiconductor device layer 16 at the first device regions 20 is removed during this planarization process. Alternatively, the patterned mask (not shown) can be removed from the structure utilizing a conventional resist stripping process after the epitaxial growth and before the planarization.

After providing the substantially planar upper surfaces, one or more isolation regions 30, such as shallow trench isolation regions, can be typically formed between the first and second device regions 20 and 40 (as shown in FIG. 2C), so as to isolate the different device regions 20 and 40. The isolation region 30 are formed utilizing conventional processing steps as described hereinabove.

A surface dielectric layer 18 may also be formed atop the second semiconductor device layer 17 (as shown in FIG. 2C) by a thermal process, such as oxidation, or by a conventional deposition process such as chemical vapor deposition (CVD), plasma-enhanced CVD, atomic layer deposition, chemical solution deposition as well as other like deposition processes. The surface dielectric layer 18 can comprise an oxide, nitride, oxynitride or other insulating layer, and it preferably has a thickness of from about 3 to about 500 nm, with a thickness of from about 5 to about 20 nm being more highly preferred. A portion of such optional surface dielectric layer 18 can function as the gate dielectric 26 for one FET device, and another portion of such surface dielectric layer 18 functions as the gate dielectric 46 for another, complementary FET device.

The resultant hybrid orientation substrate formed by the above-described process is shown in FIG. 2C. Consequently, the first and second device regions 20 and 40 comprises the first and second semiconductor device layers 16 and 17 that have different crystallographic orientations and are both electrically isolated from the base substrate 12, thereby forming floating semiconductor bodies at both the first and second device regions 20 and 40.

Subsequently, conventional CMOS processing steps can be carried out to form the FET structures as shown in FIG. 1. Such CMOS processing steps are well known in the art and therefore are not described in detail herein.

Note that while FIGS. 1-2C illustratively demonstrate exemplary CMOS device structures according to specific embodiments of the present invention, it is clear that a person ordinarily skilled in the art can readily modify such device structures for adaptation to specific application requirements, consistent with the above descriptions. For example, while the semiconductor substrates shown in FIGS. 1-2C represent a bulk base semiconductor substrate 12, it should be appreciated that a semiconductor-on-insulator (SOI) substrate can also be used as the base substrate 12 for practice of the present application. Further, while the {110} and {100} crystal planes of single crystal silicon are primarily illustrated by FIGS. 1-2C for forming the p-FET and the n-FET devices, other suitable crystal planes, such as the {111}, {211}, {111}, {511}, and {711} planes of single crystal silicon, can also be used in any suitable combination for practice of the present invention. Moreover, other single crystal semiconductor substrate materials with non-cubic unit cells, such as single crystal gallium nitride having hexagonal unit cells, can also be used for fabricating the CMOS devices of the present invention, as long as such other single crystal semiconductor materials contain different sets of crystal planes that have different carrier mobility values. A person ordinarily skilled in the art can readily modify the device structures illustrated in FIGS. 1-2C for adaptation to other substrate structures, crystal orientations, or semiconductor materials, consistent with the spirit and principles of the present invention.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A substrate structure comprising:
a base semiconductor having a first conductivity type and a first crystallographic orientation;
one or more first device regions located over the base semiconductor substrate, wherein said one or more first device regions comprised an insulator layer with a first semiconductor device layer located thereover, and wherein said first semiconductor device layer has a second, different crystallographic orientation; and
one or more second device regions located over the base semiconductor substrate in which the insulator layer is not present, wherein said one or more second device regions comprise a counter-doped semiconductor layer of a second, opposite conductivity type with a second semiconductor device layer located thereover, and wherein said second semiconductor device layer has the first crystallographic orientation, and wherein said counter-doped semiconductor layer is formed directly on and in contact to said substrate.

2. The substrate structure of claim 1, wherein the first and second semiconductor device layers have substantially coplanar upper surfaces.

3. The substrate structure of claim 1, further comprising one or more isolation regions between the first and second device regions.

4. The substrate structure of claim 1, further comprising a surface dielectric layer that overlays both the first and second semiconductor device layers at the first and second device regions.

5. The substrate structure of claim 1, wherein the base semiconductor substrate, the first semiconductor device layer, and the second semiconductor device layer all comprise single crystal silicon.

6. The substrate structure of claim 5, wherein the first device regions are n-channel field effect transistor (n-FET) device regions, wherein the second, different crystallographic orientation is one of the <100> orientations of silicon, wherein the second device regions are p-channel field effect transistor (p-FET) device regions, and wherein the first crystallographic orientation is one of the <110> orientations of silicon.

7. The substrate structure of claim 5, wherein the first device regions are p-channel field effect transistor (p-FET) device regions, wherein the second, different crystallographic orientation is one of the <110> orientations of silicon, wherein the second device regions are n-channel field effect transistor (n-FET) device regions, and wherein the first crystallographic orientation is one of the <100> orientations of silicon.

8. The substrate structure of claim 1, wherein the insulator layer in the first device regions has a thickness ranging from about 5 nm to about 300 nm.

9. The substrate structure of claim 1, wherein the counter-doped semiconductor layer in the second device regions has a thickness ranging from about 5 nm to about 100 nm.

10. The substrate structure of claim 1, wherein the first and second semiconductor device layers each has a thickness ranging from about 5 nm to about 150 nm.

11. The substrate structure of claim 1, wherein the counter-doped semiconductor layer has a dopant concentration ranging from about $10^{14}/cm^3$ to about $10^{20}/cm^3$.

12. A semiconductor device comprising:
the substrate structure of claim 1, wherein the base semiconductor substrate, the first semiconductor device layer, and the second semiconductor device layer all comprise single crystal silicon, wherein the first crystallographic orientation is one of the <110> orientations of silicon, and wherein the second, different crystallographic orientation is one of the <100> orientations of silicon;
one or more n-channel field effect transistors (n-FETs) located at the one or more first device regions; and
one or more p-channel field effect transistors (p-FETs) located at the one or more second device regions.

13. A semiconductor device comprising:
the substrate structure of claim 1, wherein the base semiconductor substrate, the first semiconductor device layer, and the second semiconductor device layer all comprise single crystal silicon, wherein the first crystallographic orientation is one of the <100> orientations of silicon, and wherein the second, different crystallographic orientation is one of the <110> orientations of silicon;
one or more p-channel field effect transistors (p-FETs) located at the one or more first device regions; and
one or more n-channel field effect transistors (n-FETs) located at the one or more second device regions.

* * * * *